US007799603B2

(12) United States Patent
Tsai et al.

(10) Patent No.: US 7,799,603 B2
(45) Date of Patent: Sep. 21, 2010

(54) METHOD FOR MOUNTING ELECTRONIC COMPONENT ON PRINTED CIRCUIT BOARD

(75) Inventors: Chung-Jen Tsai, Tayuan (TW); Chia-Cheng Chen, Tayuan (TW); Hung-Yi Chang, Tayuan (TW); Tung-Yao Kuo, Tayuan (TW); Cheng-Hsien Lin, Tayuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 0 days.

(21) Appl. No.: 12/466,361

(22) Filed: May 14, 2009

(65) Prior Publication Data

US 2010/0003784 A1 Jan. 7, 2010

(30) Foreign Application Priority Data

Jul. 4, 2008 (CN) ........................ 2008 1 0302557

(51) Int. Cl.
*H01L 21/52* (2006.01)

(52) U.S. Cl. ........................................................ 438/106

(58) Field of Classification Search .......... 438/106–127
See application file for complete search history.

(56) References Cited

U.S. PATENT DOCUMENTS

| | | | | |
|---|---|---|---|---|
| 6,448,504 | B1 * | 9/2002 | Taguchi | 174/255 |
| 6,498,307 | B2 * | 12/2002 | Ichihara et al. | 174/260 |
| 6,723,583 | B2 * | 4/2004 | Takahashi et al. | 438/114 |
| 7,007,379 | B2 * | 3/2006 | Komatsubara et al. | 29/846 |

* cited by examiner

*Primary Examiner*—Savitri Mulpuri
(74) *Attorney, Agent, or Firm*—Raymond J. Chew

(57) ABSTRACT

A method for assembling an electronic component on a printed circuit board includes following steps. Firstly, a printed circuit board substrate including a central main portion and a peripheral unwanted portion is provided. Secondly, electrically conductive patterns and reinforcing patterns are formed on the main portion and the unwanted portion respectively. Thirdly, an electronic component is mounted on the main portion and electrically connected with the electrically conductive patterns. Fifthly, the unwanted portion is removed.

2 Claims, 12 Drawing Sheets

METHOD FOR MOUNTING ELECTRONIC COMPONENT ON PRINTED CIRCUIT BOARD

BACKGROUND

1. Technical Field

The present disclosure generally relates to printed circuit boards (PCBs), particularly relates to a method for mounting an electronic component on a PCB.

2. Description of Related Art

PCBs are important components in various electronic devices. To meet miniaturization requirements of electronic devices, PCBs have becoming thinner in thickness. However, warpage may occur in periphery of a thin PCB due to internal stress occurring therein. Specifically to the thin PCB assembled with electronic components, the warpage can cause the PCB and electronic components mounted on the PCB to fail functioning. Thus, the usage of the PCB is seriously affected.

What is needed, therefore, is a method for mounting an electronic component on a PCB to overcome the above-described problems.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

A method for mounting an electronic component on a PCB according to embodiments will now be described in detail below with reference to the drawings.

The method includes the steps in no particular order of:

(1) providing a PCB substrate, the PCB substrate including a main portion and a peripheral unwanted portion;

(2) forming electrically conductive patterns on the main portion;

(3) forming reinforcing patterns on the unwanted portion;

(4) providing an electronic component;

(5) mounting the electronic component on the main portion of the substrate via the electrically conductive patterns; and (6) removing the unwanted portion.

Figure 1:
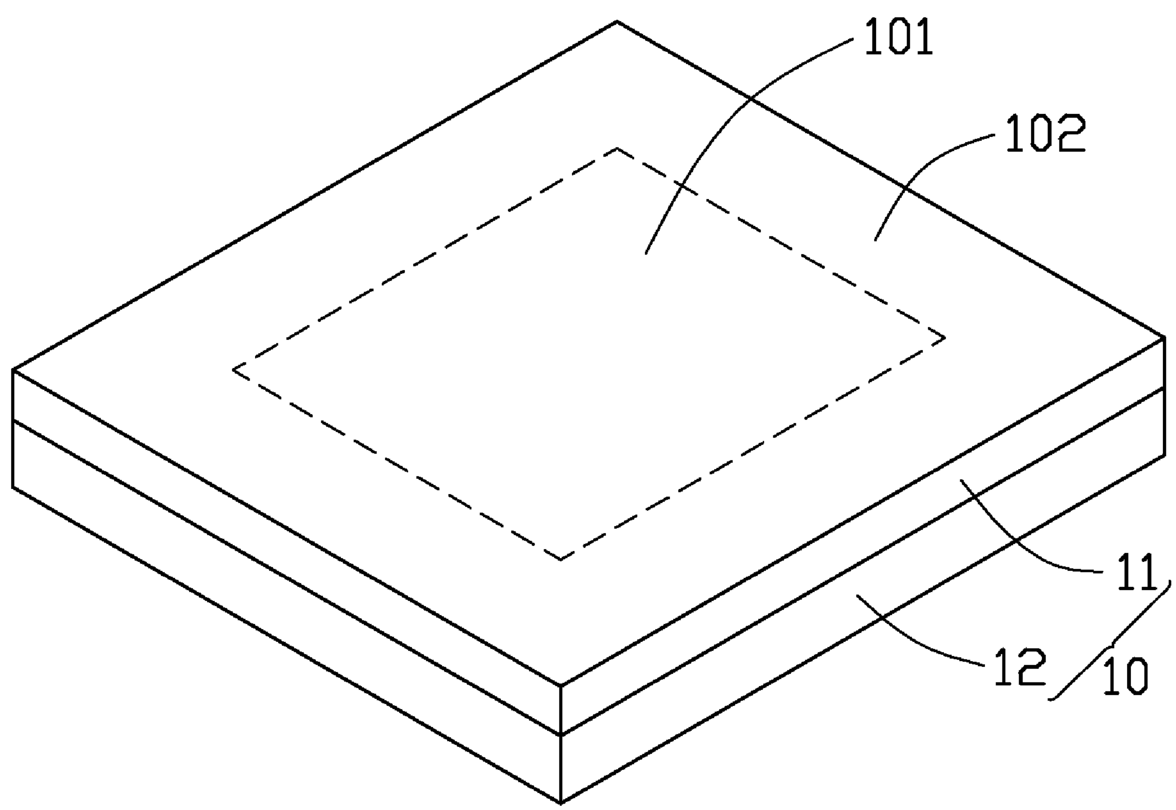
FIG. 1 is a schematic view of a PCB substrate, which includes a main portion and a peripheral unwanted portion, in accordance with a first embodiment.

Referring to FIG. 1, in step (1), a PCB substrate 10 is provided.

The PCB substrate 10 can be a single-sided copper clad laminate (single-sided CCL), a double-sided copper clad laminate (double-sided CCL), or another kind of preformed multilayer PCB substrate. In the illustrated embodiment, the PCB substrate 10 includes an electrically conductive layer 11 and an insulation layer 12. The electrically conductive layer 11 is a copper layer, configured for forming electrical traces and connecting contacts. The insulation layer 12 can be comprised of polyimide, polyethylene terephthalate, polytetrafluorethylene, polyamide, polymethylmethacrylate, polycarbonate, polyamide-polyethylene terephthalate copolymer, glass fiber resin compound, or other materials. The printed circuit board substrate 10 defines a central main portion 101 and a peripheral unwanted portion 102 surrounding the main portion 101. The main portion 101 has a shape corresponding to a printed circuit board product. In the illustrated embodiment, the main portion 101 is rectangular shaped. The unwanted portion 102 is a sacrificial portion, and is configured for supporting/reinforcing the main portion 101 and will be removed in a later step.

Referring to FIGS. 2-6, in the illustrated embodiment, steps (2) and (3) are processed simultaneously. Electrically conductive patterns 11_a_ and reinforcing patterns 11_b_ are formed from the electrically conductive layer 11 using a photo-lithographic process.

Figure 2:
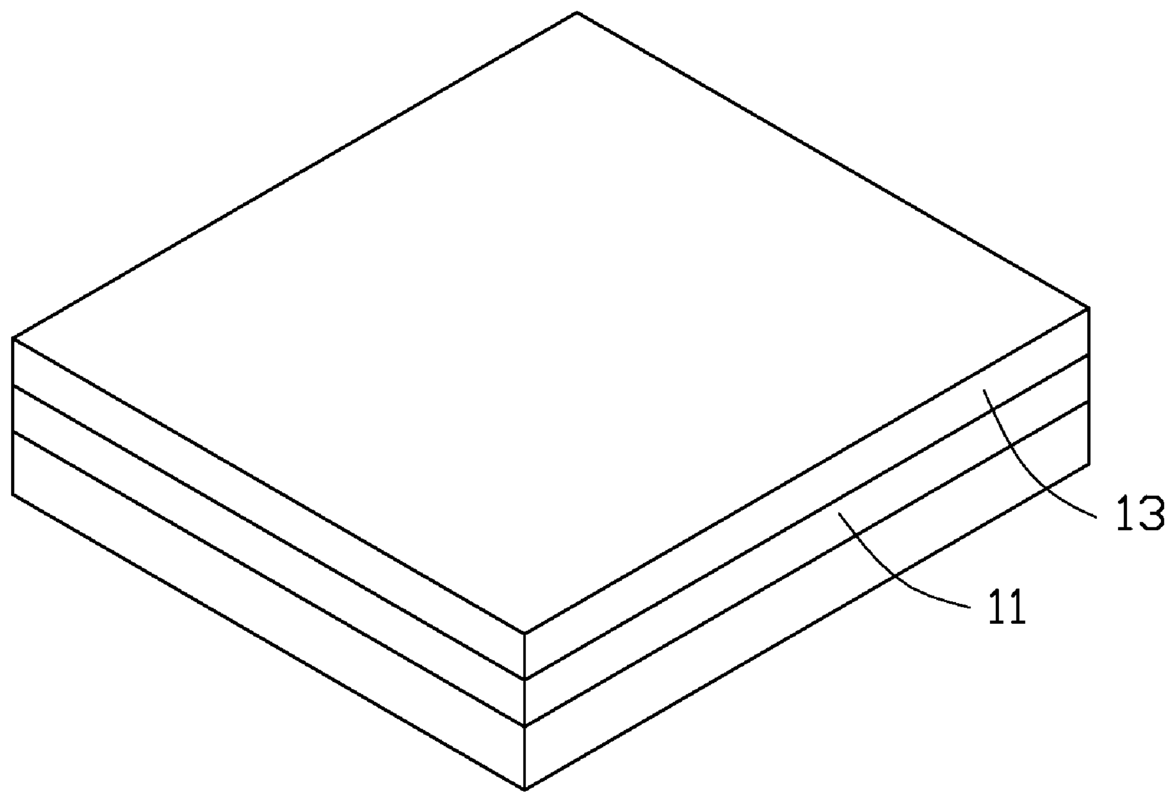
FIG. 2 is similar to FIG. 1, but showing a photoresist layer applied onto the PCB substrate.

Referring to FIG. 2, a photoresist layer 13 is applied onto a top surface of the electrically conductive layer 11 to cover the electrically conductive layer 11. The photoresist layer 13 is comprised of negative photoresist, which is capable of being polymerized under irradiation of light. In addition, the photoresist layer 13 can also be positive photoresist, which is capable of being decomposed under irradiation of light.

Figure 3:
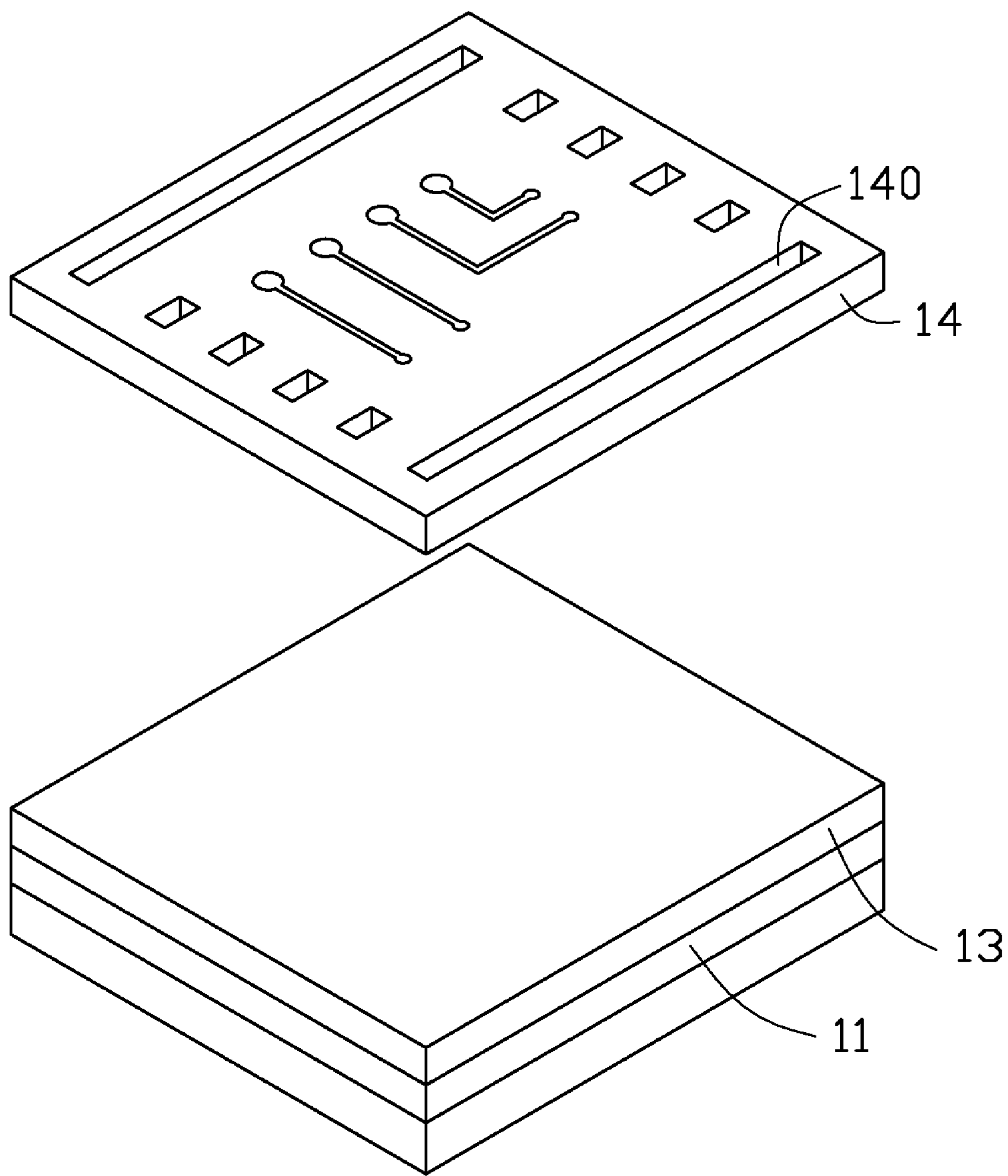
FIG. 3 is similar to FIG. 2, but showing a photomask used to expose the photoresist layer.

Referring to FIG. 3, the photoresist layer 13 is exposed by a light source (not shown) and a photomask 14. The photomask 14 has pattern-like openings 140 allowing light (e.g. UV-light) to pass through to irradiate the photoresist layer 13. The openings 140 defined in a central portion of the photomask 14 have shapes corresponding to the electrically conductive patterns 11_a_. As an example, openings 140 defined in a central portion of the photomask 14 have shapes of four electrical traces as shown in FIG. 3. The openings 140 defined in a peripheral portion of the photomask 14 have shapes corresponding to the reinforcing patterns 11_b_. As an example, openings 140 have shapes of eight rectangles as shown in FIG. 3. Thus, portions of the photoresist layer 13 corresponding to the openings 140 are exposed and polymerized, whilst other portions of the photoresist layer 13 are not exposed and not polymerized.

Figure 4:
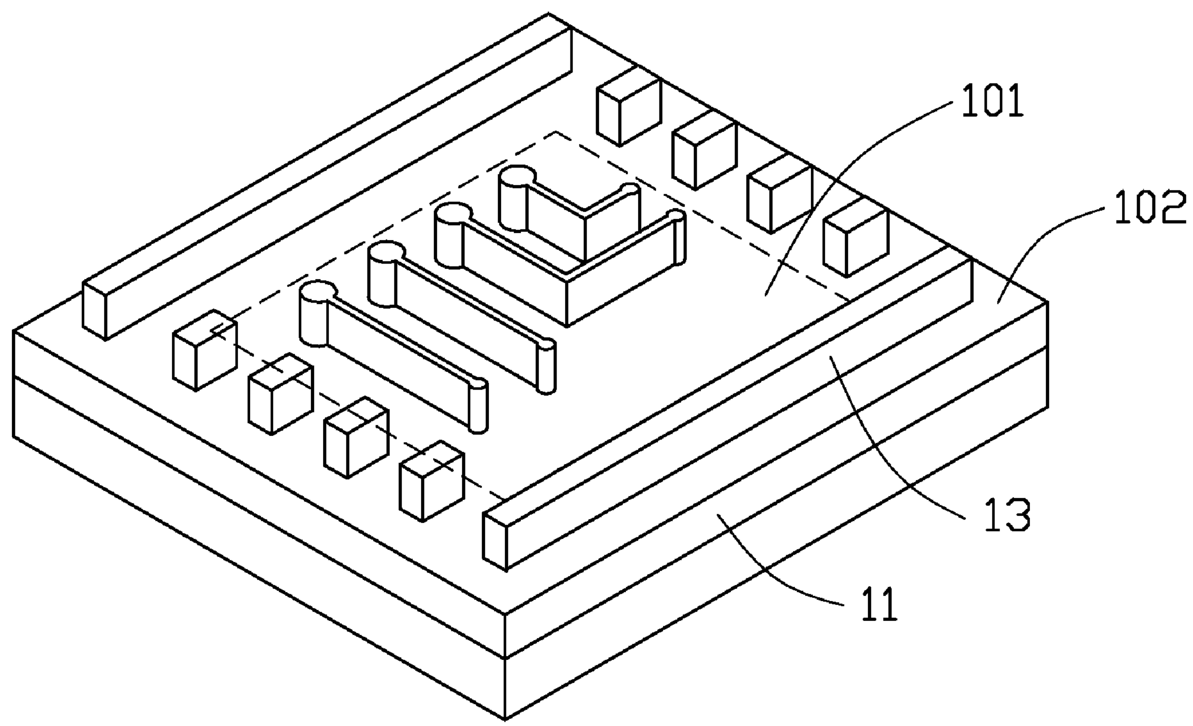
FIG. 4 is similar to FIG. 3, but showing the photoresist layer developed.

Referring to FIG. 4, the photoresist layer 13 is developed by dipping in the developer (not shown) thereof. The polymerized portions of the photoresist layer 13 remain on the electrically conductive layer 11, while other not polymerized portions of the photoresist layer 13 are decomposed by the developer and removed from the electrically conductive layer 11. Thus, patterns of the openings 140 are transferred to the photoresist layer 13.

Figure 5:
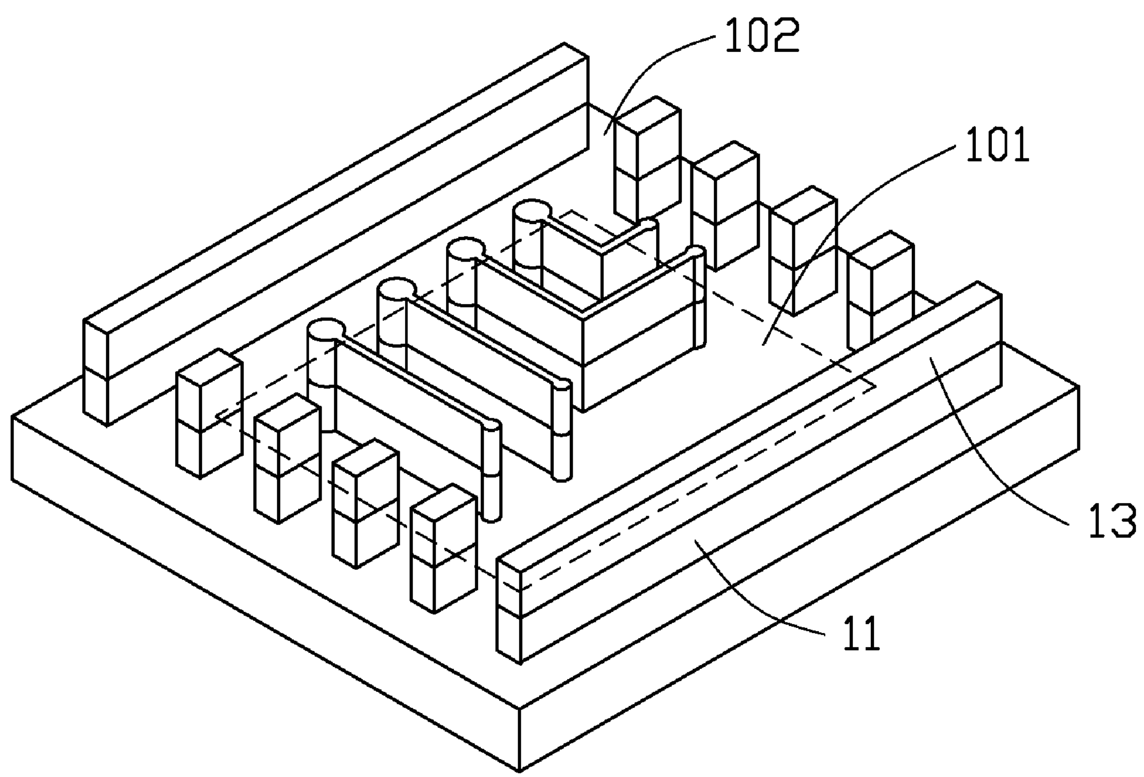
FIG. 5 is similar to FIG. 4, but showing the PCB etched.

Referring to FIG. 5, the electrically conductive layer 11 is etched by a copper etching solution (not shown). Thus, portions of the electrically conductive layer 11, which is attached with the remaining photoresist layer 13, is remained on the insulation layer 12; other portions of the electrically conductive layer 12, which not attached with the remaining photoresist layer 13, is etched and removed by the copper etching solution from the insulation layer 12.

Figure 6:
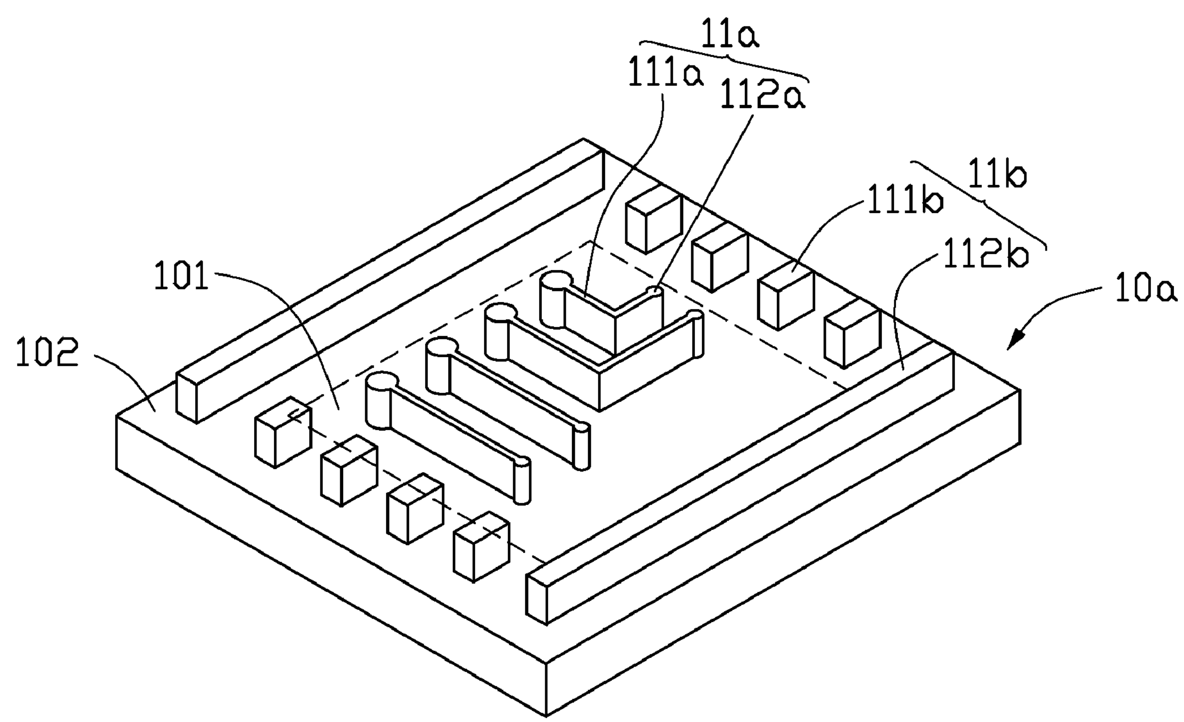
FIG. 6 is a schematic view of a preformed PCB, which is obtained by removing the photoresist layer.

Fifthly, referring to FIG. 6, after removing the remaining photoresist layer 13, a preformed PCB is obtained with the electrically conductive patterns 11*a* formed on the main portion 101 and the reinforcing patterns 11*b* formed on the unwanted portion 102. The electrically conductive patterns 11*a* are configured for connecting with electronic components and transmitting electrical signals. The reinforcing patterns 11*b* are configured for counteracting and compensating internal stress present in the preformed PCB 10*a* which may otherwise cause warping deformation.

In the illustrated embodiment, the electrically conductive patterns 11*a* include four electrical traces 111*a* and eight connecting contacts 112*a*. Each end of each of the electrical traces 111*a* is connected with one connecting contact 112*a*. The electrical traces 111*a* are configured for transmitting electrical signals. The connecting contacts 112*a* are configured for connecting with electronic components or other traces. The reinforcing patterns 11*b* includes eight reinforcing blocks 111*b* formed on two opposite sides of the electrically conductive patterns 11*a* and two reinforcing bars 112*b* formed on two other opposite sides of the electrically conductive patterns 11*a*, respectively. Therefore, the electrically conductive patterns 11*a* are surrounded by the reinforcing patterns 11*b*.

It is understood that flatness of the preformed PCB 10*a* could readily be maintained because of the reinforcing patterns 11*b*. For one, due to the weight of the reinforcing patterns 11*b*, warpage is difficult to occur in the peripheral unwanted portion 102 of the preformed PCB 10*a*. For another, due to the same processes in processing the main portion 101 and the unwanted portion 102, the preformed PCB 10*a* has small internal stress generated during the manufacturing processes.

In addition, the electrically conductive patterns 11*a* also can be formed before or after forming the reinforcing patterns 11*b*. The electrically conductive patterns 11*a* and the reinforcing patterns 11*b* can also be formed by laser ablation or other processing methods.

Figure 7:
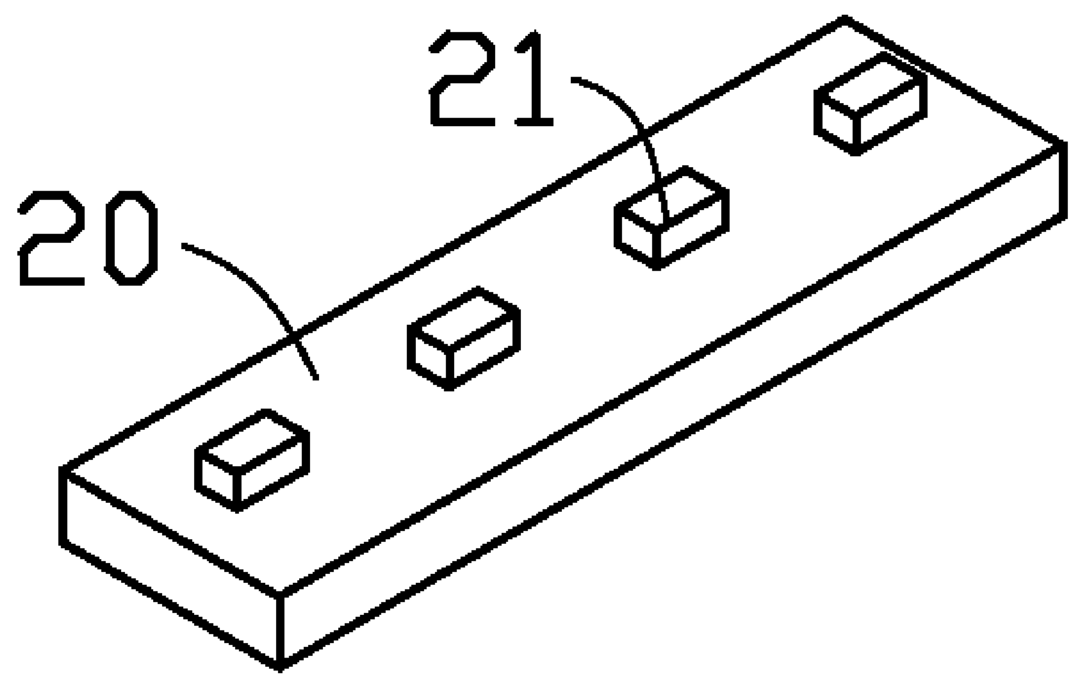
FIG. 7 is a schematic view of an electronic component.

Referring to FIG. 7, in step (4), an electronic component 20 is provided. The electronic component 20 has a number of electrically conductive terminals 21. In the illustrated embodiment, the electronic component 20 is a chip, which has four solder bumps act as electrically conductive terminals 21. The four solder bumps are in correspondence with four connecting contacts 112*a* of electrically conductive patterns 11*a*.

Figure 8:
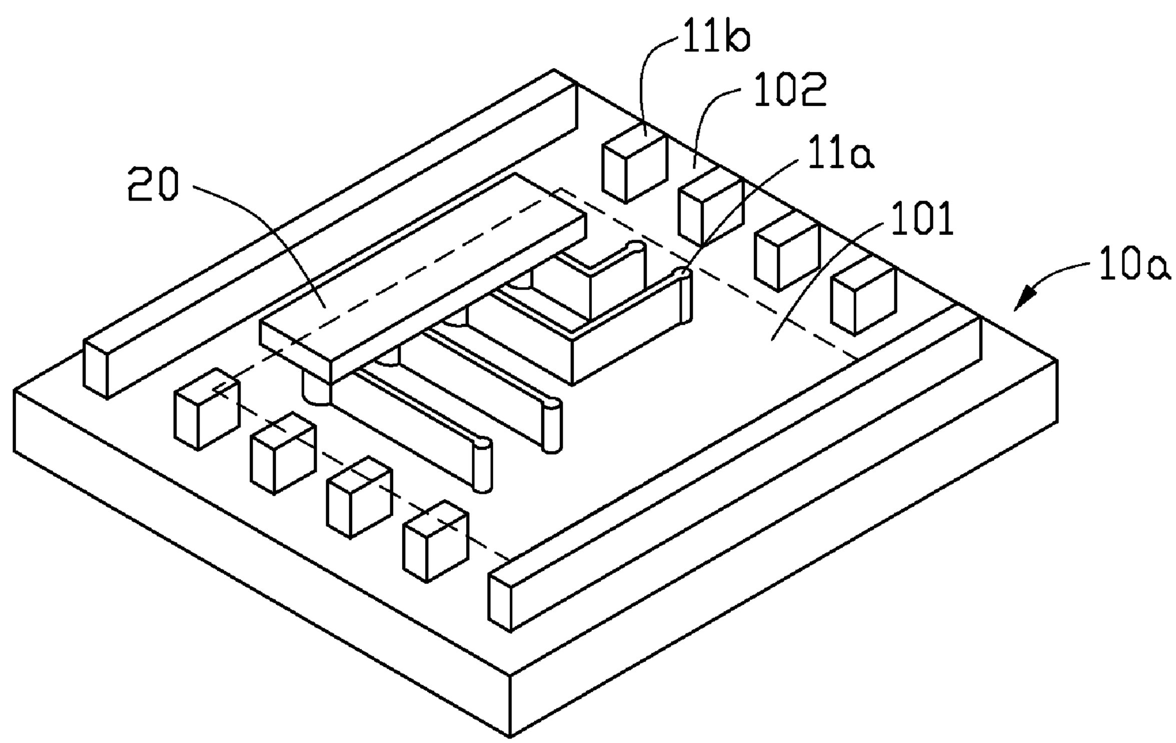
FIG. 8 is a schematic view of the preformed PCB of FIG. 6 with the electronic component of FIG. 7 thereon.

Referring to FIG. 8, in step (5), the electronic component 20 is mounted on the main portion 101 of the preformed PCB 10*a* via the electrically conductive patterns ll*a*. In detail, the electronic component 20 is flipped onto the preformed PCB 10*a*, and the four solder bumps are bonded to four connecting contacts 112*a* respectively after reflow soldering. Thus, the electronic component 20 and the preformed PCB 10*a* are electrically connected.

Because the preformed PCB 10*a* is flat enough during the assembling process, the electrically conductive terminals 21 of the electronic component 20 can be precisely and securely bonded with the connecting contacts 112*a* of the preformed PCB 10*a*. The electronic component 20 would hardly be failed.

It is noted that the electronic component 20 also can have other types of electrically conductive terminals 21, and can be assembled onto the preformed PCB 10*a* by other assembling technologies such as surface mounting technology (SMT).

Figure 9:
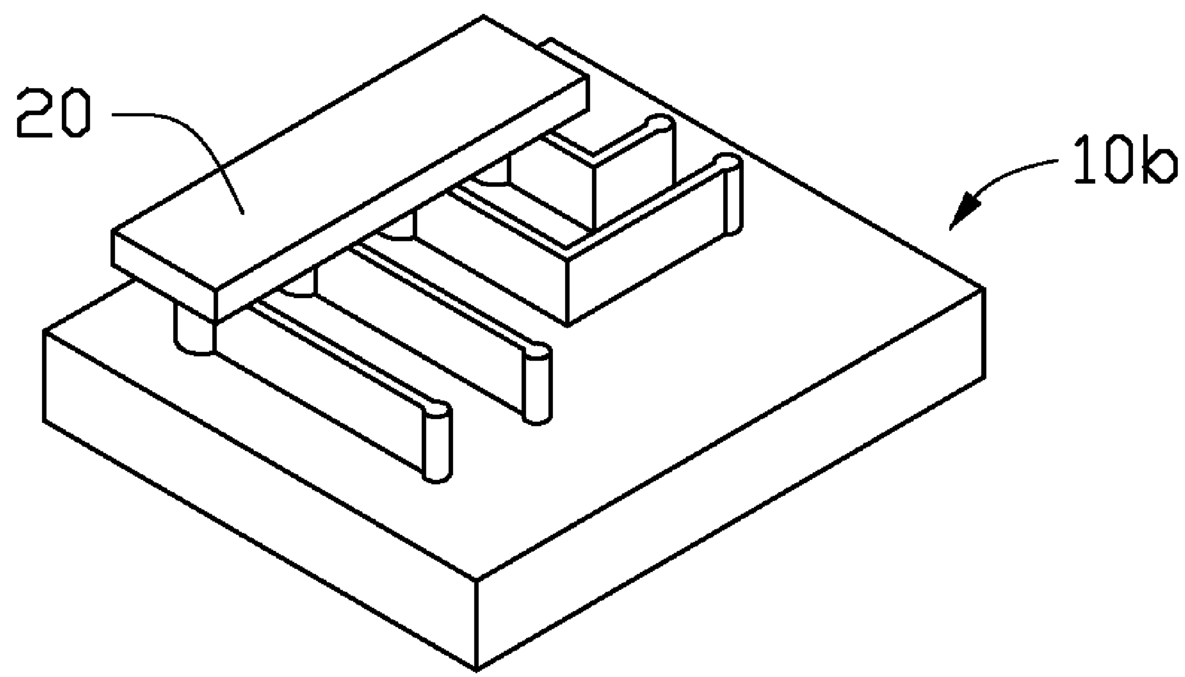
FIG. 9 is similar to FIG. 8, but showing the unwanted portion removed.

Referring to FIG. 9, in step (6), the unwanted portion 102 is removed. Thus, a PCB 10*b* assembled with the electronic component 20 is obtained. The PCB 10*b* has small internal stress presented therein and long component lifetime.

Figure 10:
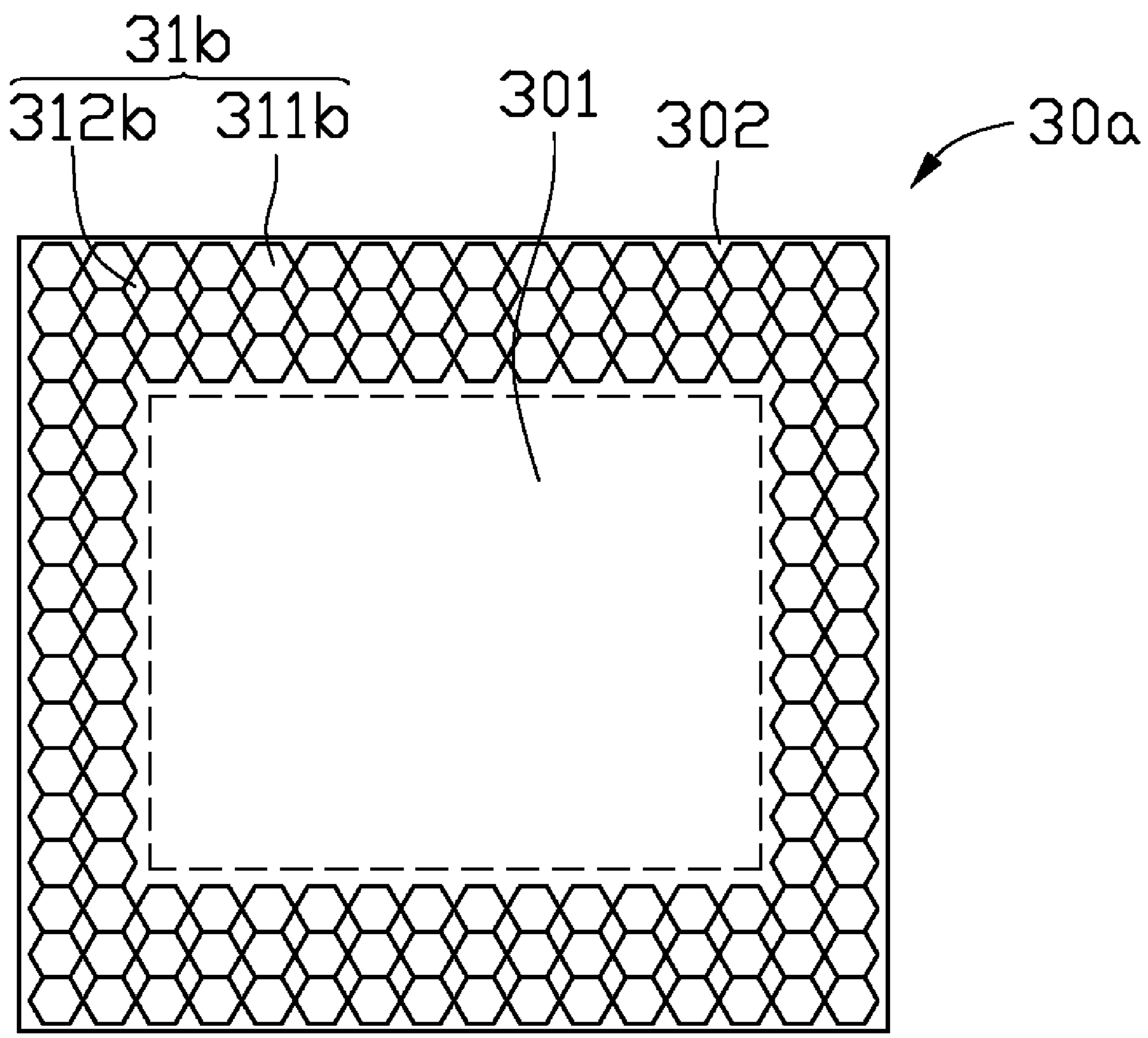
FIG. 10 is a schematic, top view of a preformed PCB, in accordance with a second embodiment.

Referring to FIG. 10, a preformed printed circuit board 30*a* having reinforcing patterns 31*b* defined in a peripheral unwanted portion 302, in accordance with a second embodiment, is shown. It is understood that electrically conductive patterns formed in a central main portion 301 which is surrounded by the unwanted portion 302 are not shown. The reinforcing patterns 31*b* include a plurality of connected hexagon shaped blocks 311*b* and a plurality of openings 312*b* defined between the blocks 311*b*. The reinforcing patterns 31*b* can make the preformed printed circuit board 30*a* in a flat state too.

Figure 11:
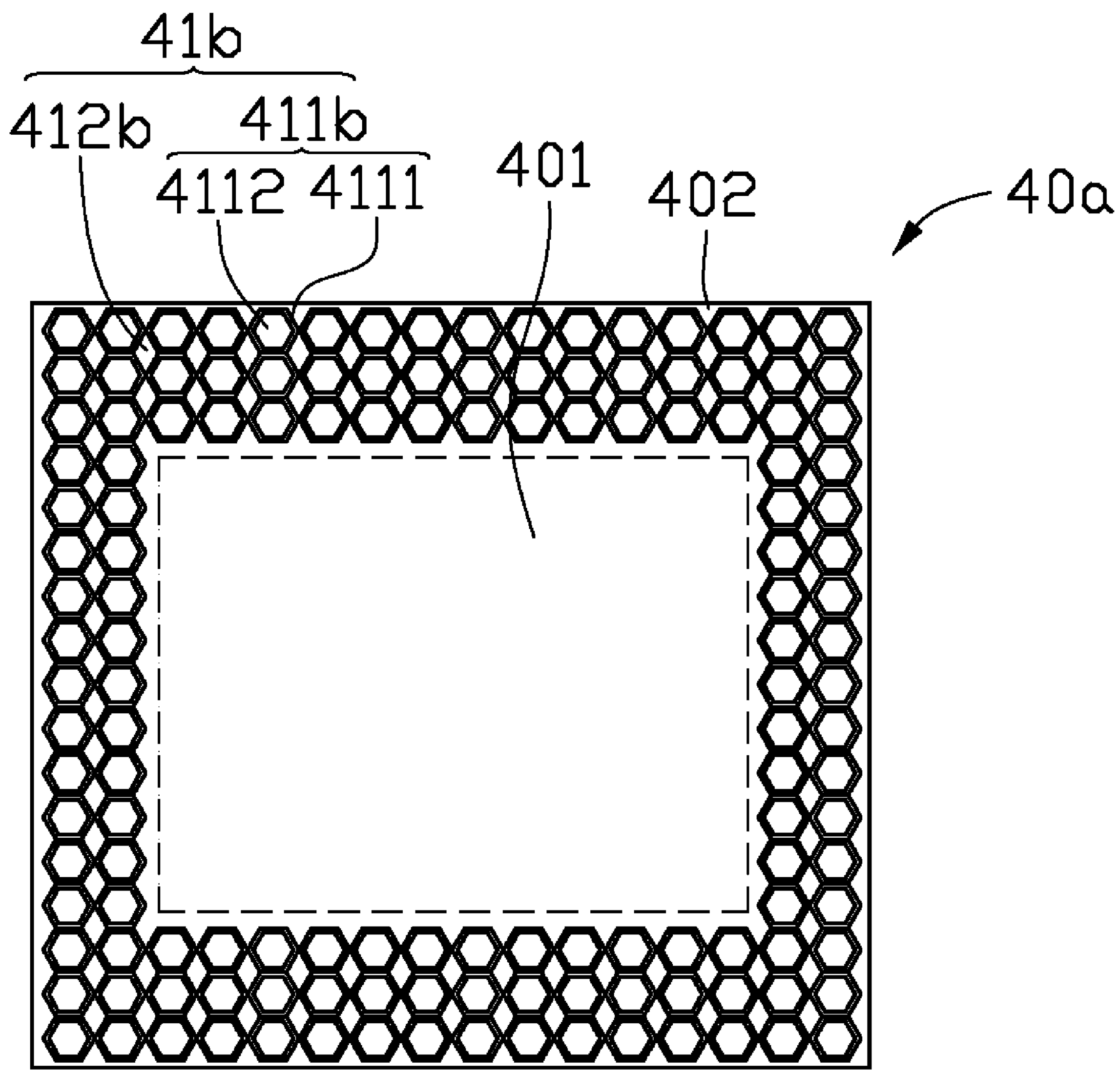
FIG. 11 is a schematic, top view of a preformed PCB, in accordance with a third embodiment.

Referring to FIG. 11, a preformed printed circuit board 40*a* having reinforcing patterns 41*b* defined in a peripheral unwanted portion 402, in accordance with a third embodiment, is shown. It is understood that electrically conductive patterns formed in a central main portion 401 are not shown. The reinforcing patterns 41*b* include a plurality of hexagon shaped grids 411*b* and a plurality of openings 412*b* defined therebetween. Each of the grids 411*b* constitute six electrically conductive lines 4111 joined end to end and a hole 4112 defined by the electrically conductive lines 4111. Thus, the reinforcing patterns 41*b* have cellular shapes.

Figure 12:
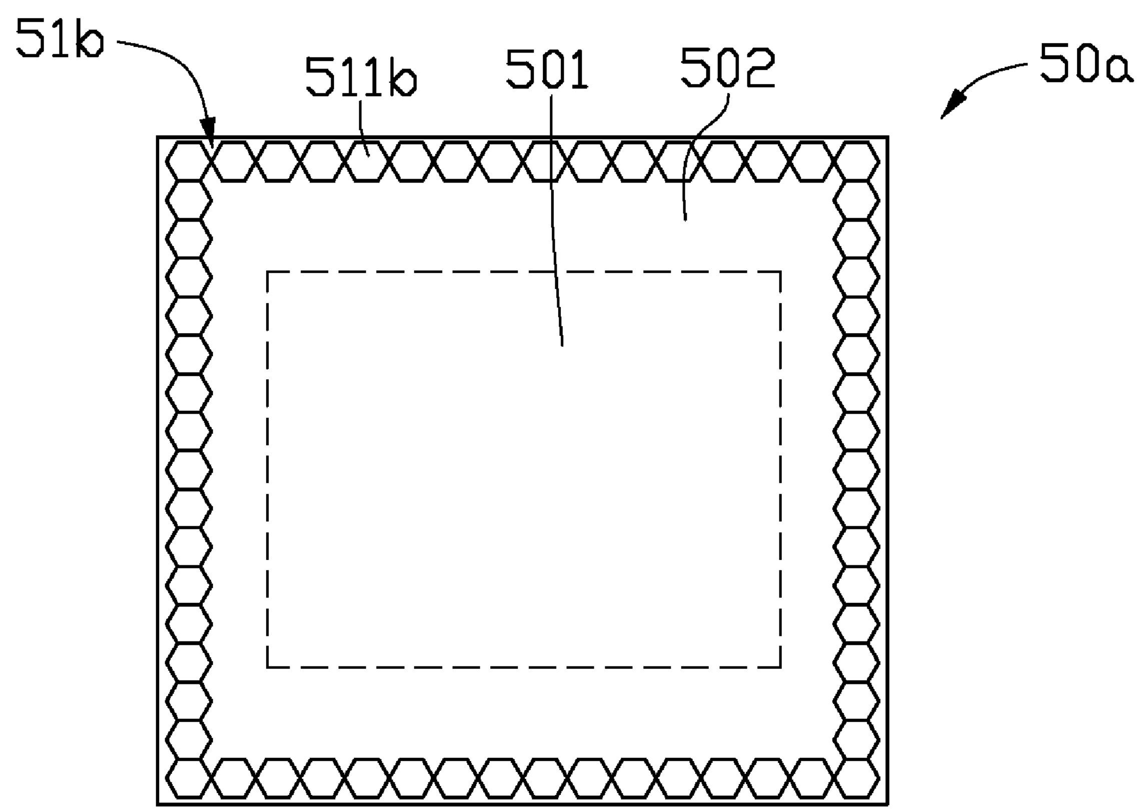
FIG. 12 is a schematic, top view of a preformed PCB, in accordance with a fourth embodiment.

Referring to FIG. 12, a preformed printed circuit board 50*a* having reinforcing patterns 51*b* defined in a peripheral unwanted portion 502, in accordance with a fourth embodiment, is shown. It is understood that electrically conductive patterns formed in a central main portion 501 are not shown. The reinforcing patterns 51*b* include a plurality of connected hexagon shaped blocks 511*b*, but the blocks 511*b* only defined in a most peripheral section of the unwanted portion 502. The reinforcing patterns 51*b* also can counteract a warpage of the preformed PCB 50*a* which may otherwise cause due to internal stress present therein.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

The invention claimed is:

1. A method for mounting an electronic component on a printed circuit board, comprising:

providing a printed circuit board substrate, the printed circuit board substrate including a central main portion and a peripheral unwanted portion;

forming electrically conductive patterns on the main portion;

forming reinforcing patterns on the unwanted portion, wherein a plurality of reinforcing blocks and a plurality of openings are formed in the step of forming reinforcing patterns;

mounting an electronic component on the main portion of the substrate and electrically connecting the electronic component to the electrically conductive patterns, wherein the reinforcing patterns are formed on the unwanted portion prior to mounting the electronic component on the main portion; and removing the unwanted portion.

2. A method for mounting an electronic component on a printed circuit board, comprising:

providing a printed circuit board substrate, the printed circuit board substrate including a central main portion and a peripheral unwanted portion;

forming electrically conductive patterns on the main portion;

forming reinforcing patterns on the unwanted portion, wherein a plurality of reinforcing grids are formed in the step of forming reinforcing patterns;

mounting an electronic component on the main portion of the substrate and electrically connecting the electronic component to the electrically conductive patterns wherein the reinforcing patterns are formed on the unwanted portion prior to mounting the electronic component on the main portion; and removing the unwanted portion, wherein the unwanted portion is removed after mounting the electronic component on the main portion of the substrate.

* * * * *